United States Patent [19]
Kim et al.

[11] Patent Number: 6,103,448
[45] Date of Patent: Aug. 15, 2000

[54] ORGANOMETAL-CONTAINING ACRYLATE OR METHACRYLATE DERIVATIVES AND PHOTORESISTS CONTAINING THE POLYMERS THEREOF

[75] Inventors: Jin Baek Kim; Hyun Woo Kim, both of Seoul, Rep. of Korea

[73] Assignee: Korea Advanced Institute of Science and Technology, Taejeon, Rep. of Korea

[21] Appl. No.: 09/149,953

[22] Filed: Sep. 9, 1998

[30] Foreign Application Priority Data

Oct. 8, 1997 [KR] Rep. of Korea ............... 97-51623

[51] Int. Cl.$^7$ .................................... G03C 1/492
[52] U.S. Cl. ........................... 430/270.1; 430/286.1; 525/364
[58] Field of Search .................. 430/270.1, 281.1, 430/286.1, 447; 437/419.8; 436/76, 77; 525/364

[56] References Cited

U.S. PATENT DOCUMENTS

| | | | |
|---|---|---|---|
| 4,481,049 | 11/1984 | Reichmanis et al. | 156/643 |
| 4,788,127 | 11/1988 | Bailey et al. | 430/192 |
| 4,898,895 | 2/1990 | Masuoka et al. | 523/122 |
| 4,935,094 | 6/1990 | Mixon et al. | 156/643 |
| 5,206,298 | 4/1993 | Kawaguchi | 525/283 |
| 5,856,071 | 1/1999 | Kotachi et al. | 430/326 |

*Primary Examiner*—Janet Baxter
*Assistant Examiner*—Yvette M. Clarke
*Attorney, Agent, or Firm*—Greer, Burns & Crain, Ltd.

[57] ABSTRACT

Organometal-containing acrylate or methacrylate derivatives and photoresists comprising the polymers thereof. Unlike conventional matrix polymers of photoresist, the polymers induce a difference in silicon content between exposed regions and unexposed regions of photoresists by releasing their silicon-containing side chains with the aid of acid in a chemical amplification manner. The difference in silicon content causes the exposed regions to be etched at a different rate from that of the unexposed regions under oxygen plasma. Thus, the photoresist material makes it possible to use a microlithographic process comprising a dry development step which can advantageously prevent the deformation or collapse of patterns which is aggravated as their aspect ratio increases, as well as the photoresist is economically more favorable than a top surface imaging system to which silylation on its top surface or a multi-level resist system to which wet development on its top layer must be applied, because the microlithographic process is very simple and no solvent is released.

3 Claims, 8 Drawing Sheets

ORGANOMETAL-CONTAINING ACRYLATE OR METHACRYLATE DERIVATIVES AND PHOTORESISTS CONTAINING THE POLYMERS THEREOF

BACKGROUND OF THE INVENTION

1. Field of the Invention

The present invention relates to novel acrylate or methacrylate derivatives and photoresists containing the polymers thereof. More particularly, the present invention relates to organometal-containing acrylate or methacrylate derivatives and photoresists which make it possible to use a microlithographic process comprising a dry development step which can advantageously prevent the deformation or collapse of patterns, which is aggravated as their aspect ratio increases.

2. Description of the Prior Art

The high integration of semiconductor devices has always been supported by a significant advance in microlithography, a core technique in the art and thus, followed by a momentous progress in photoresist. One of the most widely used photoresists is that which comprises a styrenic polymer which is usually synthesized by free radical, cationic or anionic polymerization and which is changeable in chemical properties when being exposed to deep UV light.

A detailed description is disclosed in U.S. Pat. No. 4,491,628 of a resist which comprises a polymer with an acid labile side chain, such as t-butyl ester or t-butyl carbonate, and a photoacid generator which produces acid upon exposure to UV light. The selected polymer is a vinyl polymer, such as polystyrene or polyacrylate while the photoacid generator is an onium salt, such as diaryliodonium salt or triarylsulfonium salt. At the regions irradiated with UV light, acid is generated, detaching the acid labile protecting groups from the main chain, which makes the polymer have a different polarity from that of non-irradiated regions. Taking advantage of this difference in polarity, a polar or non-polar developing solution enables the photoresist to express a negative or positive image.

When being applied for microelectronics, such a solution-developable photoresist has a serious problem: the patterns are more easily deformed and collapsed upon wet developing and rinsing as their aspect ratio (ratio of height to width) increases. In order to avoid this problem, several measures were taken, including use of a matrix polymer of high strength or high adhesiveness to the substrate and selection of proper developing solution and rinsing solvent.

However, because the increase of the aspect ratio is indispensable while the adhesiveness cannot exceed a limit, the measures have to be used restrictively. For these reasons, there is a need for developing a novel resist which is dry-developable by using, for example, anisotropic $O_2$ reactive ion etching (RIE).

SUMMARY OF THE INVENTION

The present invention fulfills the need and defines novel monomers which are polymerized into the matrix polymers and novel photoresists comprising the polymers which can be developed in a dry manner. Preferably, a matrix polymer is formed which can be dry-developed by use of anisotropic, reactive ion etching. Unlike those obtained by wet development, the patterns obtained by dry development stand upright without deformation or collapse.

BRIEF DESCRIPTION OF THE PRESENT INVENTION

DETAILED DESCRIPTION OF THE INVENTION

Figure 1:
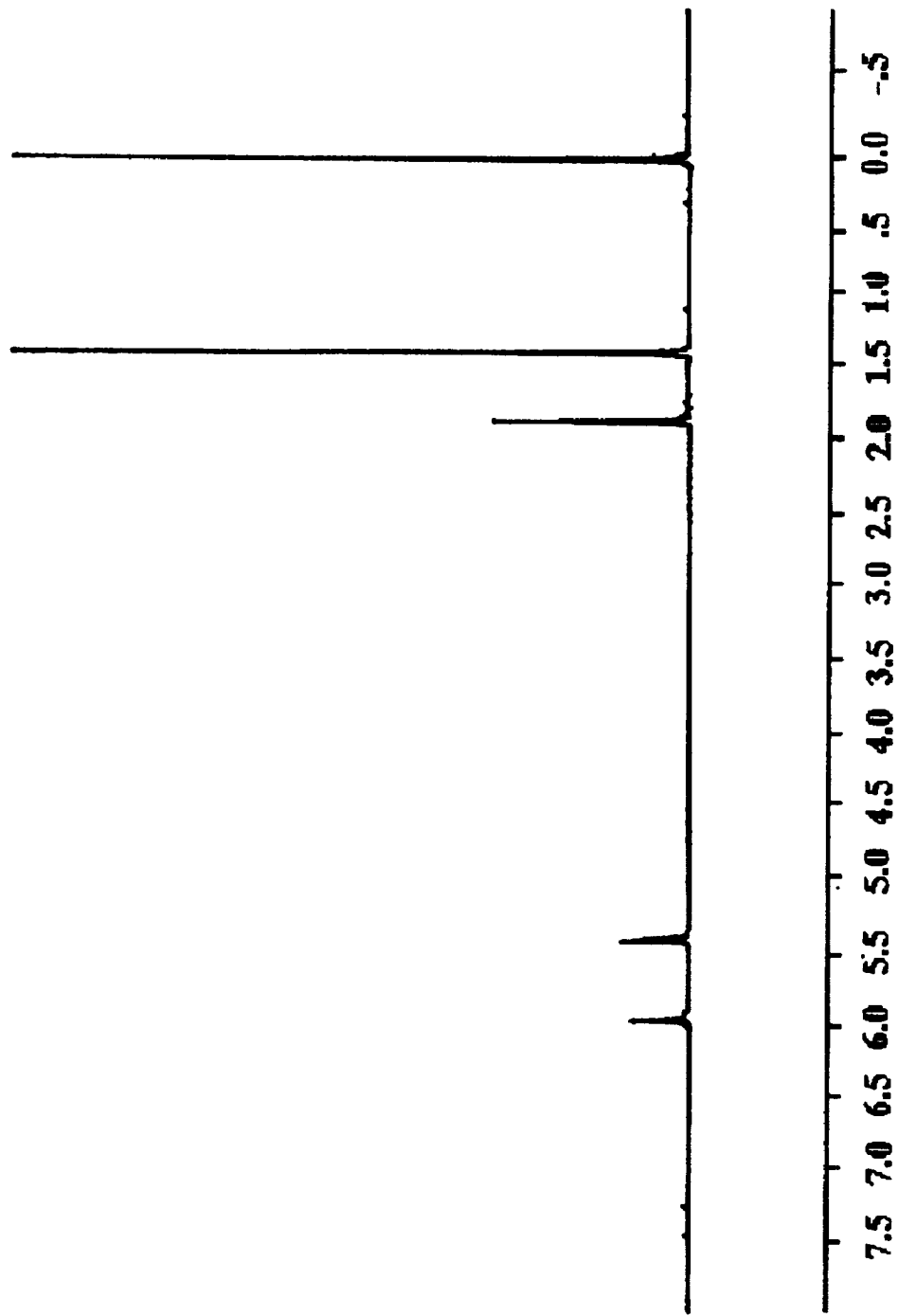
FIG. 1 is a $^1$H-NMR spectrum for 2-trimethylsilyl-2-propyl methacrylate.

The present invention may be understood more readily by reference to the following detailed description of preferred embodiments of the invention and the Figures.

Before the present monomers, polymers and photoresists are disclosed and described, it is to be understood that the terminology used herein is for the purpose of describing particular embodiments only and is not intended to be limiting. It must be noted that, as used in the specification and the appended claims, the singular forms "a", "an" and "the" include plural referents unless the context clearly dictates otherwise.

Throughout this application, where publications are referenced, the disclosures of these publications in their entireties are hereby incorporated by reference into this application in order to more fully describe the state of the art to which this invention pertains.

The present invention provides organometal-containing acrylate or methacrylate derivatives, represented by the following formulas I to III:

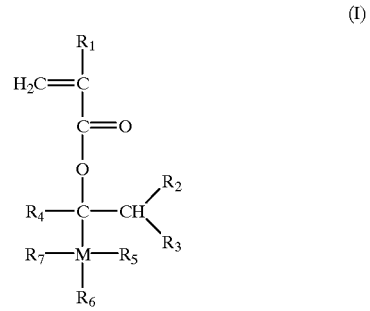

(I)

-continued

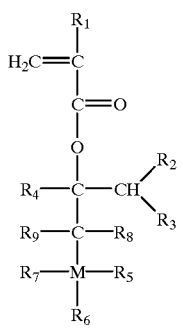
(II)

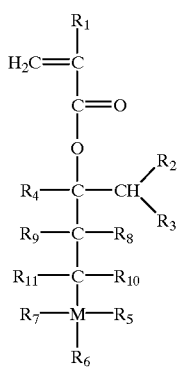
(III)

wherein, $R_1$ is hydrogen or an alkyl containing 1 to 4 carbon atoms; $R_2$ to $R_{11}$ independently represent hydrogen, an alkyl containing 1 to 4 carbon atoms, an alkoxy containing 1 to 4 carbon atoms, a phenyl, a benzyl, a phenoxy or —$MR'_3$ wherein R' is an alkyl containing 1 to 4 carbon atoms, an alkoxy containing 1 to 4 carbon atoms, a phenyl, a benzyl or a phenoxy; and M represents Si, Ge, Sn or OSi.

Upon exposure to deep UV light (248 nm or 193 nm) in the presence of a photoacid generator, the present acrylate derivatives produce the compounds of the following formulas IV–VI:

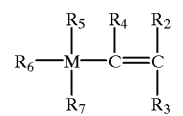
(IV)

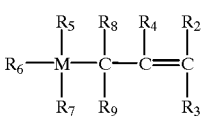
(V)

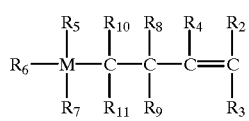
(VI)

wherein, $R_2$–$R_{11}$ and M are respectively as defined above. These compounds of the Formulas IV–VI are each able to have volatility at post-exposure baking (PEB) temperatures, depending on $R_2$–$R_{11}$. Unless they show volatility, they can be removed by extraction. In other words, the polymers which are homo- or copolymerized from the acrylate monomers of the present invention can be subjected to dry development.

In accordance with another aspect of the present invention, there is provided a photoresist comprising a polymer containing at least one of the acrylate or methacrylate monomers. For instance, the polymer polymerized from the monomers is dissolved in cyclohexanone or propylene glycol methyl ether acetate (PGMEA), together with 1–10 wt % of a photoacid generator, to give a photoresist. In a lithographic process, a coat of the photoresist solution is selectively exposed to deep UV light and then subjected to PEB. During the PEB, the side chains comprising silicon of the coat are decomposed into the compound of the Formula IV, V or VI, which is volatile at the PEB temperature, at the exposed regions by the acid catalyst generated whereas the unexposed regions are stable, maintaining the same silicon content with the initial value. At this time, there forms a latent image which will be developed to a pattern if the surface on which the image appears is applied with an oxygen reactive ion etching process because the exposed regions decompose to evaporate whereas the unexposed regions are not etched by the protection of a $SiO_x$ film which is formed on their surface by virtue of the remaining silicon.

The present dry-developable photoresist gives good sensivity because the silicon containing side chains in a chemical amplification concept is introduced, and the photoresist of the present invention is economically more favorable than a top surface imaging or a multi-level resist system to which silylation on its top surface or wet development on its top layer must be applied, because the lithographic process is very simple and no solvent is released.

The synthesis of the novel acrylate derivatives of the Formulas I–III may be accomplished by the reaction of the organometal-containing alcohols, represented by the following formulas VIII–IX, with chloroformic acid derivatives:

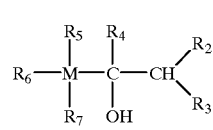
(VII)

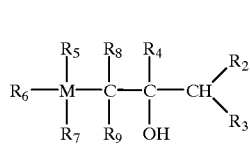
(VIII)

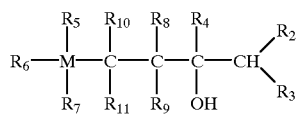
(IX)

wherein, $R_2$–$R_{11}$ and M are as defined above. The organometal-containing alcohols of the Formula VII–IX may be synthesized according to the instruction of J. Organomet. Chem., 49 (1973), C9–C12; J. Org. Chem., 45 (1980), 3571–3578; Tetrahedron Lett., (1976), 1591–1594; J. Organomet. Chem., (1981), 33–47. Useful examples of the formic acid derivatives include methacryloyl chloride and acryloyl chloride, both of which are commercially available. The synthesis of the desired monomers from the reaction of the alcohols of the Formulas VII–IX with methacryloyl chloride or acryloyl chloride may be achieved according to the methods disclosed in J. Org. Chem., 35 (1970), 1198–1199; Bulletin of the Chemical Society of Japan, 49 (1976), 2335–2336; Angew. Chem. Int. Ed. Engl., 17 (1978), 522–523 and the present inventors followed the methods.

The novel monomers of the Formulas I–III are polymerized to the polymers which are useful as matrix polymers for dry-developable photoresist by virtue of their sensitivity to deep UV light and resistance to oxygen plasma. The monomers of the Formulas I–III may be polymerized alone or in combination with other monomers suitable to induce other better properties, for example, good adhesiveness to substrate and high glass transition temperature. For example, the copolymers of the present monomers with hydroxycyclohexyl methacrylate or hydroxycyclohexyl acrylate are improved in adhesiveness by the hydroxy group introduced and have a glass transition temperature (Tg) approximately 20–40° C. higher than that (115° C.) of the homopolymers from the present monomers by virtue of the ring structure of the side chain. Of course, the glass transition temperature can be controlled according to the ratio of the comonomers.

Also, introduction of an appropriate amount of methyl methacrylate or methylacylate, and methacrylic acid or acrylic acid also gives an effect of improving the adhesiveness and increasing the glass transition temperature. The ratio of the introduced monomers should be suitably controlled in consideration of the weight content of silicon, the glass transition temperature and the adhesiveness.

Alternatively, a polymer suitable for the matrix polymer for dry-developable photoresist may be prepared by directly reacting the alcohol of the Formula VII, VIII or IX with a polymer having a carboxylic acid side chain, such as poly (methacrylic acid) or poly(acrylic acid).

It is generally known to the art that the content of silicon should be at least 7% in order to give a proper difference in etching rate between the exposed regions and the un-exposed regions. One of the most basic properties which a photoresist has to have in order to use deep UV light as a light source, is a low absorbance at its wavelength. It was found that the homopolymers of the present monomers showed an absorbance of 0.034 and 0.150 at 248 nm and 193 nm, respectively, when the photoresist was 1 micron thick.

A better understanding of the present invention may be obtained in light of the following examples which are set forth to illustrate, but are not to be construed to limit, the present invention.

EXAMPLE I

Synthesis of 2-Trimethylsilyl-2-propanol

To a solution of methyl lithium (100 ml, 1.4 M, 140 mmol) in ether is dropwise added acetyltrimethyl silane (18 ml, 127 mmol) at 0° C. for one hour with the aid of a syringe. This reaction was carefully neutralized with saturated aqueous ammonium chloride solution. The organic layer was washed several times with distilled water and dried with potassium carbonate. Distillation afforded 120 g of pure 2-trimethylsilyl-2-propanol: Yield 73%, b.p. 44° C. (33 torr).

$^1$H-NMR(CDCl$_3$) δ 8 0.02(9H, s, Si(CH$_3$)$_3$, 1.1(1H, s, OH), 1.18(6H, s,O—C(CH$_3$)$_2$—Si).

EXAMPLE II

Synthesis of 2-Trimethylsilyl-2-propyl methacrylate

To a solution of the 2-trimethylsilyl-2-propanol (93 mmol) obtained in Example I in 100 ml of tetrahydrofuran was dropwise added n-butyl lithium (1.5 M, 102.3 mmol) at 0° C. The solution was warmed to room temperature and then, stirred for 30 min before being returned to 0° C. Following slow addition of methacryloyl chloride (111.6 mmol), the reaction solution was warmed to room temperature and stirred for 10 min. Again, the temperature was raised to 50° C., followed by stirring the solution for one hour.

The solvent, tetrahydrofuran, was removed by a rotary evaporator and the residue was neutralized with an ammonium chloride solution. Following extraction with ether, the solution was washed several times with distilled water. The organic layer combined was dried and the residue was purified by column chromatography on silica gel eluting with ethyl acetate/hexane (1/30) to afford 2-trimethylsilyl-2-propyl methacrylate, b.p. 40° C. (2 torr).

Figure 2:
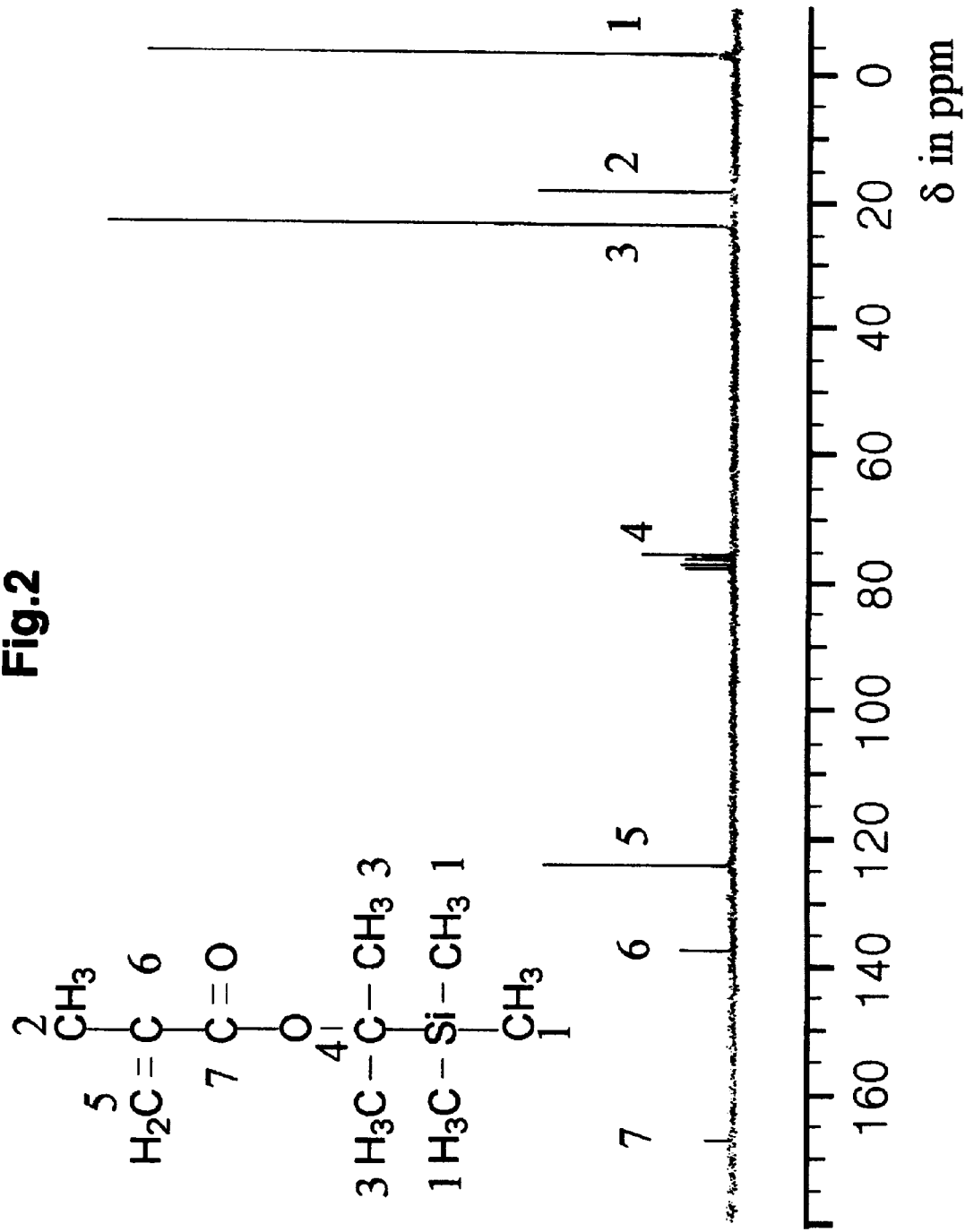
FIG. 2 is a $^{13}$C-NMR spectrum for 2-trimethylsilyl-2-propyl methacrylate.

$^1$H-NMR and $^{13}$C-NMR spectra showed that the compound was pure and had a correct structure, as shown in FIGS. 1 and 2.

$^1$H-NMR(CDCl$_3$) δ 0.06(9H, s, Si(CH$_3$)$_3$, 1.4(6H, s, O—C(CH$_3$)$_2$—si), 1.88(3H, s, CH$_3$), 5.44, 5.98(2H, s, CH$_2$=); $^{13}$C-NMR(CDCl$_3$) −2.70(Si(CH$_3$)$_3$, 18.49 (CH$_2$=C—CH$_3$), 24.15 (Si—C(CH$_3$)$_2$—O), 75.23(Si-C (CH$_3$)$_2$—O), 137.6(CH$_2$=C), 167(O=C—O).

EXAMPLE III

Synthesis of Poly(2-Trimethylsilyl-2-propyl methacrylate)

The 2-trimethylsilyl-2-propyl methacrylate (25 mmol) obtained in Example II was dissolved in benzene in a polymerization ampule, together with 2,2'-azobisisobutyronitrile (0.125 mmol), an initiator. Polymerization was carried out at 60° C. for 12 hours in a vacuum. The product was dissolved in tetrahydrofuran, precipitated in methyl alcohol and dried in vacuo. It was measured to have a number average molecular weight of approximately 30,000 and a glass transition temperature of approximately 115° C.

Figure 3:
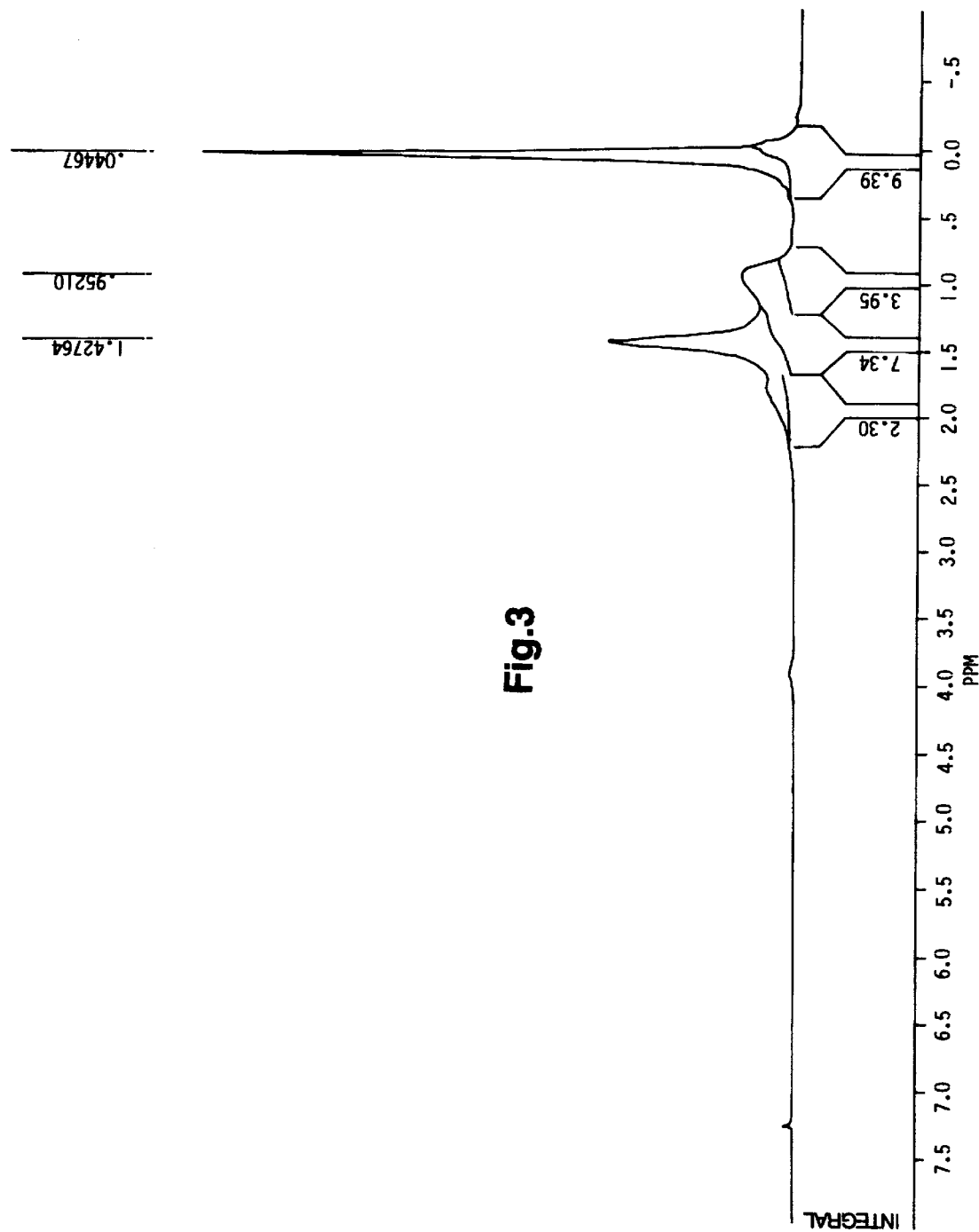
FIG. 3 is a $^1$H-NMR spectrum for poly(2-trimethylsilyl-2-propyl methacrylate).

As shown in FIG. 3, the polymer obtained was found to have a preferable structure as analyzed by $^1$H-NMR.

Figure 4:
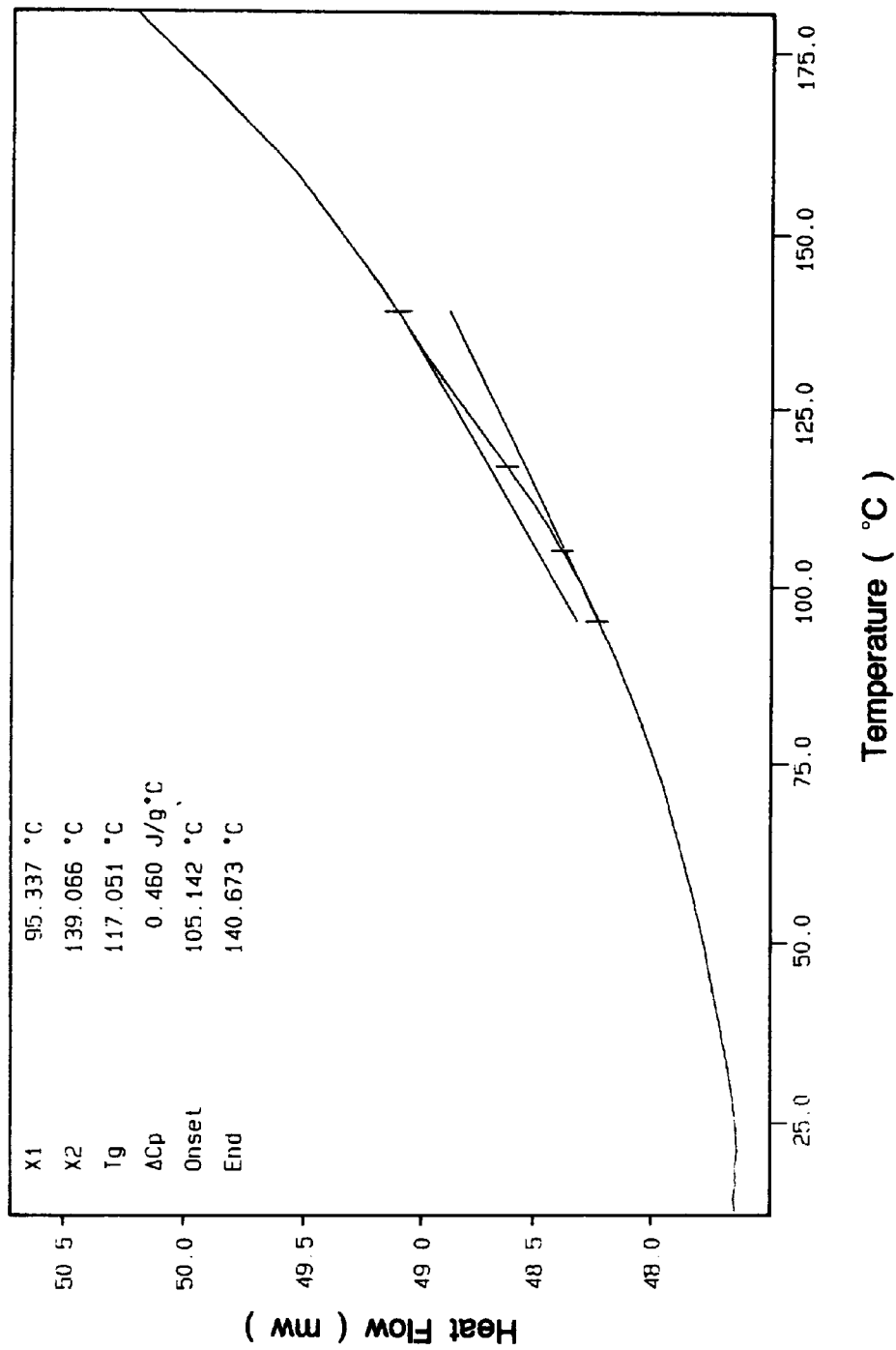
FIG. 4 is a differential scanning calorimetogram for poly(2-trimethylsilyl-2-propyl methacrylate).

As for the glass transition temperature, it was measured by DSC analysis. The data of FIG. 4 shows that Tg is determined at about 115° C. for the homopolymer.

$^1$H-NMR(CDCl$_3$) δ 0.04(9H, s, Si(CH )$_3$),$_3$0.9–2.0 (11H, m, br, O—C(CH$_3$)$_2$—Si, CH$_3$, —CH$_2$—).

EXAMPLE IV

Synthesis of Poly(2-trimetylsilyl-2-propyl Methacrylate-co-3-hydroxycyclohexyl Methacrylate)

A mix solution of the 2-trimethylsilyl-2-propylmethacrylate obtained in Example II and 3-hydroxycyclohexyl methacrylate (mole ratio 50:50) in benzene was subjected to polymerization at 60° C. for 12 hours in the presence of 2,2'-azobisisobutyronitrile, an initiator, in a polymerization ampule which was vacuumed. The product was dissolved in tetrahydrofuran, precipitated in petroleum ether and dried in vacuo.

Figure 5:
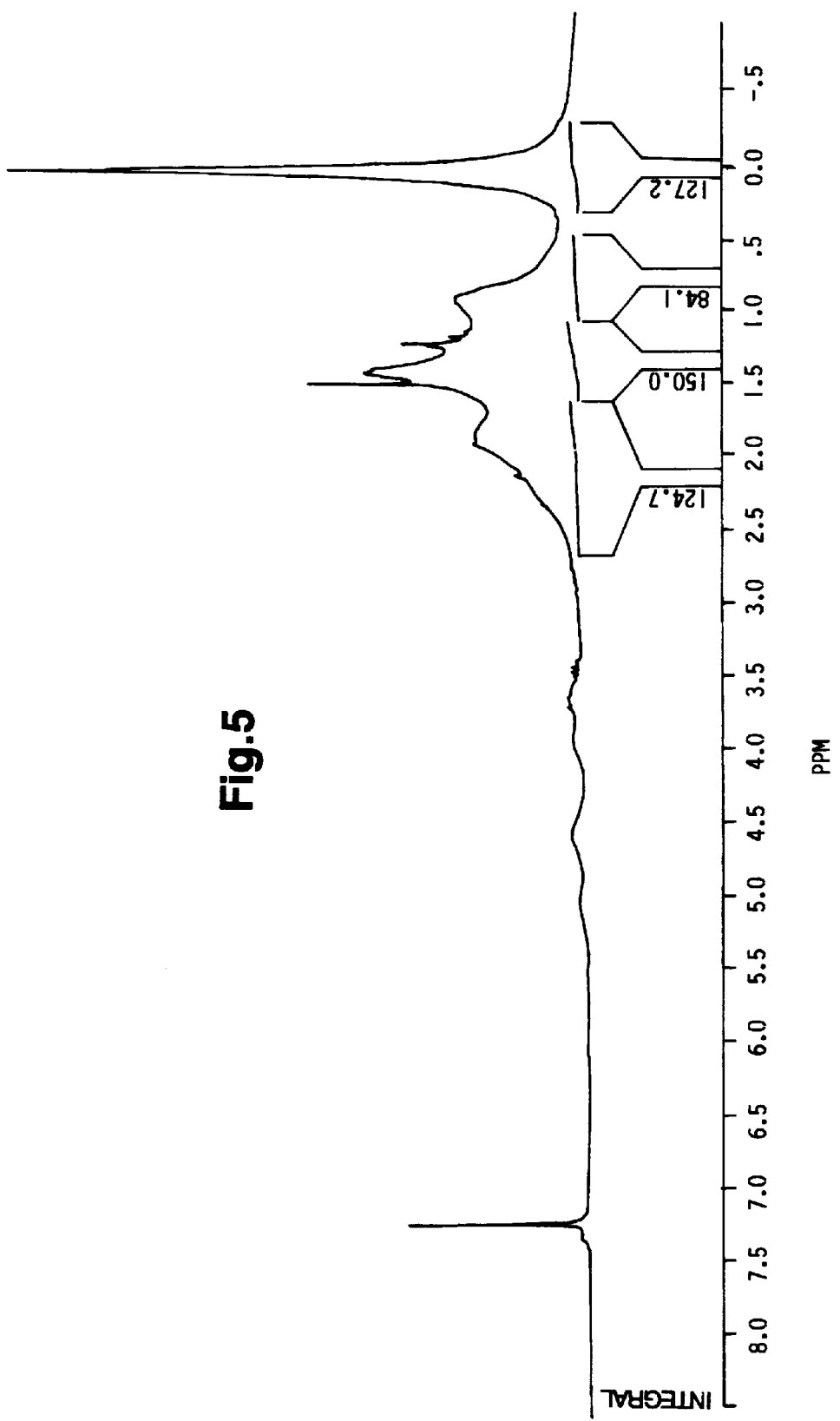
FIG. 5 is a $^1$H-NMR spectrum for poly(2-trimethylsilyl-2-propyl methacrylate-co-3-hydroxycyclohexyl methacrylate).

$^1$H-NMR analysis of FIG. 5 showed that the product was the title compound and the mole ratio of 2-trimethylsilyl-2-propyl methacrylate to 3-hydroxycyclohexyl methacrylate in the product was 50:50. Many experiments demonstrated that the monomer ratios in the copolymers produced were almost the same as those added upon reaction.

The copolymer was found to have a number average molecular weight of approximately 35,000.

Figure 6:
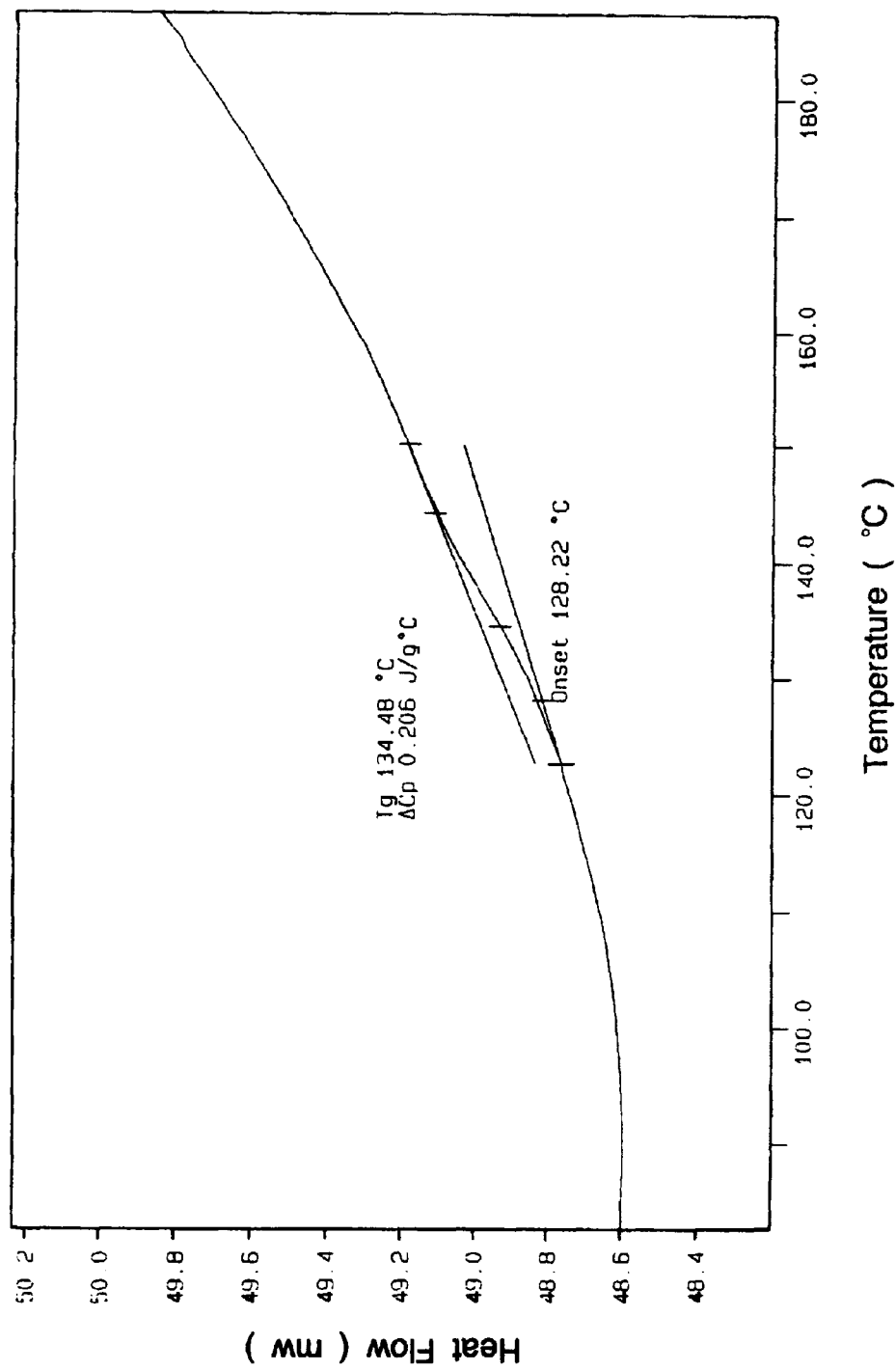
FIG. 6 is a differential scanning calorimetogram for poly(2-trimethylsilyl-2-propyl methacrylate-co-3-hydroxycyclohexyl methacrylate).

As shown in FIG. 6, the glass transition temperature of the copolymer was 135° C. as measured by DSC analysis, which was higher than that of the homopolymer by approximately 20° C., suggesting that the incorporation of suitable monomers could increase the glass transition temperature.

$^1$H-NMR(CDCl$_3$) δ 0.02(s, Si(CH$_3$)$_3$), 0.8–2.5 (m, br, O—C(CH$_3$)$_2$—Si, —CH$_2$——C$_6$H$_{10}$—OH).

EXAMPLE V

A copolymer was prepared in a similar manner to that of Example IV, except that the mole ratio of 2-trimethylsilyl-2-propyl methacrylate to 3-hydroxycyclohexyl methacrylate was 60:40.

EXAMPLE VI

Synthesis of 1,1-bis(trimethylsilyl)ethanol

To a solution of trimethylchlorosilane (20.5 g, 190 mmol) in tetrahydrofuran (30 ml) was added sodium (6.50 g, 283 mmol) and the solution was refluxed at 80° C. A solution of trimethylsilyl acetate (3.12 g, 23.6 mmol) in tetrahydrofuran (20 ml) was slowly added over one hour with the aid of a syringe and the solution was further refluxed for 30 min. Subsequently, the inorganic materials precipitated were filtered off and the solvent was removed in vacuo. The oily residue was separated by vacuum distillation to afford 1,1-bis(trimethylsilyl)ethyltrimethylsilylether: Yield 55; b.p. 110° C./24 mmHg.

A solution of 6N hydrochloric acid (1.5 ml) in dioxane (50 ml) was added to bis(trimethylsilyl)ethyltrimethylsilylether at room temperature and the solution was neutralized by addition of aqueous sodium bicarbonate solution. A process series of extraction with ether, solvent removal and vacuum distillation gave 1,1-bis(trimethylsilyl)ethanol: Yield 87%, b.p. 127° C./32 mmHg.

$^1$H-NMR spectra showed that the compound was pure and had a correct structure.

$^1$H-NMR(CDCl$_3$) δ 0.02(18H, s, Si(CH$_3$)$_3$), 1.1(1H,s, OH),1.16(3H,C—CH$_3$)

EXAMPLE VII

Synthesis of 1,1-bis(trimethylsilyl)ethylmethacrylate n-Butyl lithium (1.5 M, 110 mmol) was added dropwise to a solution of the 1,1-bis(trimethylsilyl)ethanol (100 mmol) obtained in Example V in tetrahydrofuran (100 ml) at 0° C. The solution was warmed to room temperature and then, stirred for 30 min before being returned to 0° C. Following slow addition of methacryloyl chloride (111.6 mmol), the reaction was warmed to room temperature and stirred for 10 min. Again, the temperature was raised to 50° C., followed by stirring the solution for one hour.

The solvent, tetrahydrofuran, was removed by a rotary evaporator and the residue was neutralized with an ammonium chloride solution. Following extraction with ether, the solution was washed several times with distilled water. The organic layer combined was dried and the residue was purified by column chromatography on silica gel eluting with ethyl acetate/hexane (⅓₀) to afford 1,1-bis (trimethylsilyl)ethylmethacrylate: Yield 80%.

EXAMPLE VIII

Synthesis of poly(1,1-bis(trimethylsilyl)ethyl methacrylate)

A solution of the 1,1-bis(trimethylsilyl)ethyl methacrylate (100 mmol) obtained in Example 6 in benzene was subjected to polymerization at 60° C. for 12 hours in the presence of 2,2'-azobisisobutyronitrile (1 mmol) in a polymerization ampule which was vacuumed. The product was dissolved in tetrahydrofuran, precipitated in petroleum ether and dried under reduced pressure.

EXAMPLE IX

Preparation of Photoresist Material

To a 15 wt % solution of the poly(2-trimethylsilyl-2-propyl methacrylate) synthesized in Example III in propylene glycol methylether acetate (PGMEA) was added triphenylsulfonium triflate at an amount of 5 wt % based on the weight of the polymer. The solution was filtered through a 0.1 micron teflon membrane filter to give a photoresist solution.

Figure 7:
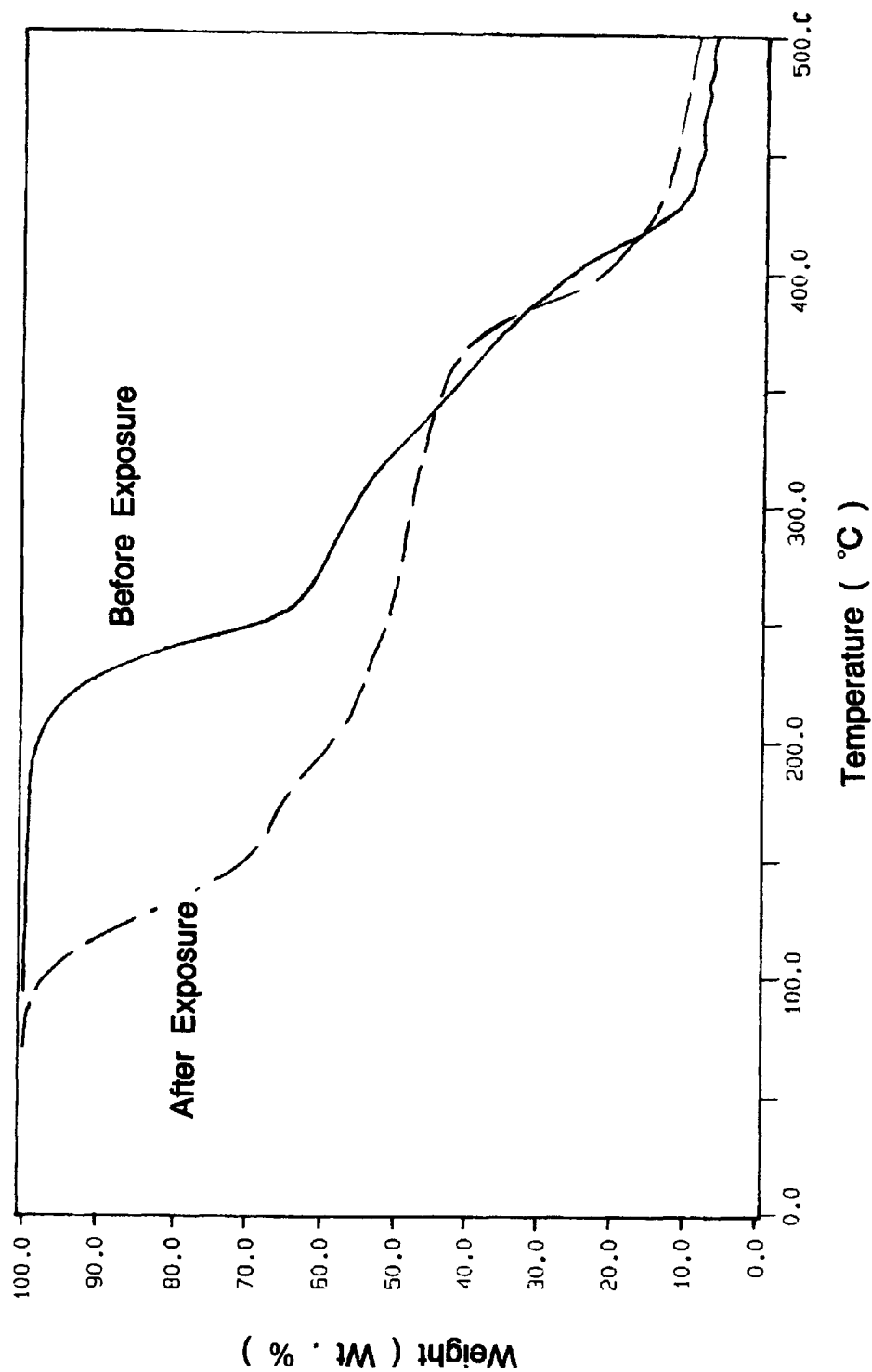
FIG. 7 is a graph showing the thermal gravity analysis for a photoresist comprising poly(2-trimethylsilyl-2-propyl methacrylate).

This photoresist solution was uniformly spin-coated to a thickness of 1 micron on a silicon wafer which was, then, cut into two. One piece was exposed to the deep UV light of 248 nm at an energy of 40 mJ/cm$^2$; the other piece was unexposed. The photoresist coat was raked from each of the pieces and tested for thermal gravity analysis (TGA). As shown in FIG. 7, the decomposition of 2-trimethylsilyl-2-propyl group started at 210° C. in the absence of acid and at 110° C. in the presence of acid.

Separately, the photoresist solution was coated on a silicon wafer as above, followed by soft-baking it at 120° C. for 4 min. After the coat was exposed through a mask to deep UV light at an energy of 40 mJ/cm$^2$, a post-exposure baking at 10 min rendered a clear latent image. When this coat was etched by use of reactive ion etching apparatus generating oxygen plasma (O$_2$ flow rate:50 sccm, pressure:100 mtorr, power:100 W), the exposed regions were etched whereas the un-exposed regions were protected by an SiO$_x$ film which was formed by the remaining silicon. In this manner, a line-and-space pattern of 0.2 microns could be obtained by contact printing. Further, finer patterns were possible under the optimal condition.

EXAMPLE X

Preparation of Photoresist Material

To a 15 wt % solution of the poly(2-trimethylsilyl-2-propyl methacrylate-co-3-hydroxycyclohexyl methacrylate) synthesized in Example V in cyclohexanone was added triphenylsulfonium triflate at an amount of 5 wt % based on the weight of the polymer. The solution was filtered through a 0.1 micron teflon membrane filter to give a photoresist solution. This solution was spin-coated on a silicon wafer as in Example IX. The coat was clearer than that of Example IX because the copolymer of Example V had hydrophilic 3-hydroxycyclohexyl methacrylate. As in Example IX, a line-and-space pattern of 0.2 micron was obtained by a series of processes including soft-baking, exposure, hard-baking, and O$_2$-reactive ion etching.

Figure 8:
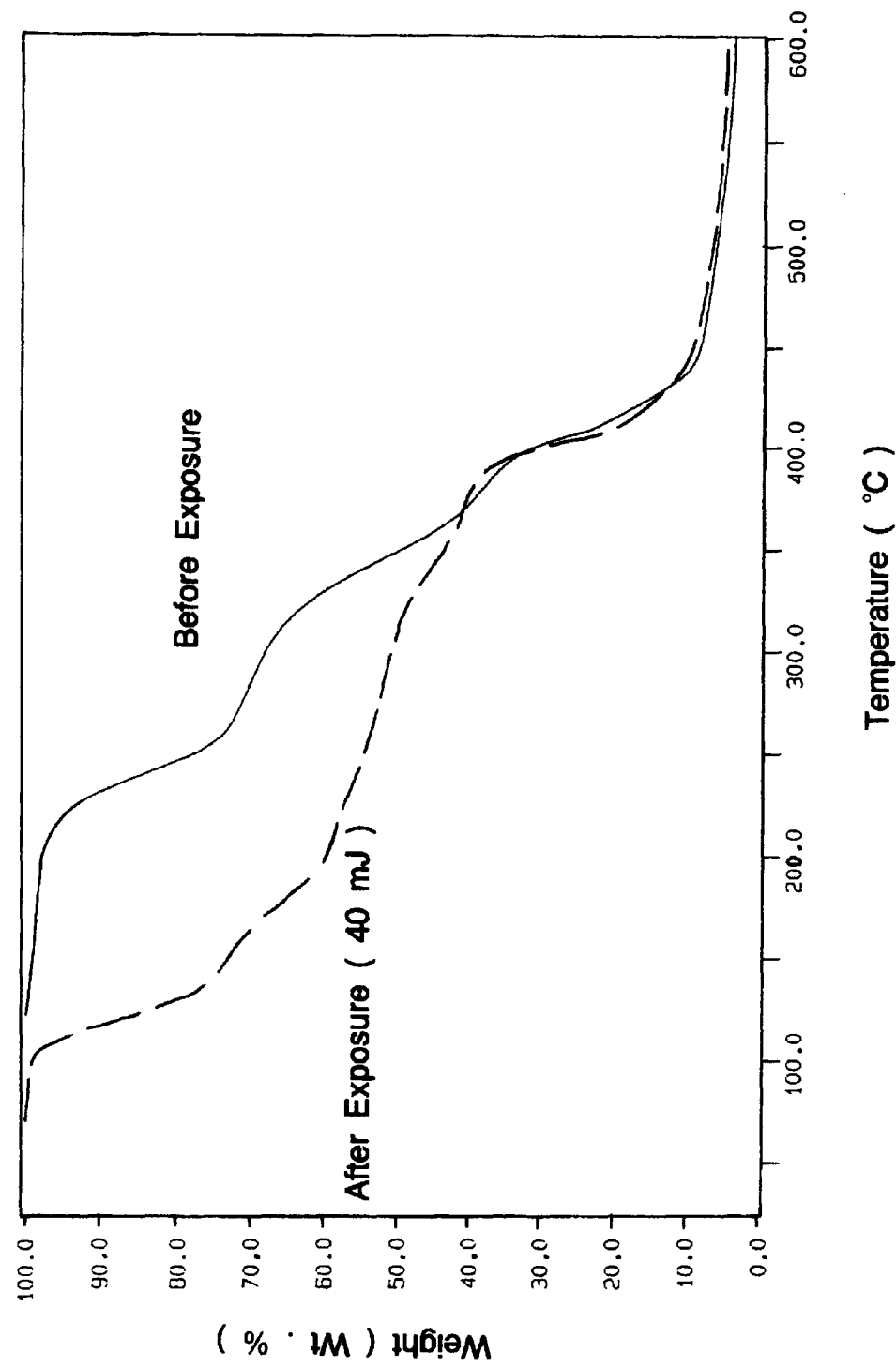
FIG. 8 is a graph showing the thermal gravity analysis for a photoresist comprising poly(2-trimethylsilyl-2-propyl methacrylate-co-3-hydroxycyclohexyl methacrylate).

For this photoresist, a thermal gravity analysis was done and gave a similar result to that of Example IX, as shown in FIG. 8.

As described hereinbefore, the photoresist material according to the present invention makes it possible to use a microlithographic process comprising a dry development step which can advantageously prevent the deformation or collapse of patterns which is aggravated as their aspect ratio increases, as well as the photoresist of the present invention is economically more favorable than a multi-level resist system to which silylation or wet development on its top surface must be applied, because the microlithographic process is very simple and no solvent is released.

It will be apparent to those skilled in the art that various modifications and variations can be made in the present invention without departing from the scope or spirit of the invention. Other embodiments of the invention will be apparent to those skilled in the art from the consideration of the specification and practice of the invention disclosed herein. It is intended that the specification and examples be considered as exemplary only, with the true scope and spirit of the invention being indicated by the following claims.

What is claimed is:

1. An organometal-containing acrylate or methacrylate derivative, represented by the following formula I, II, or III:

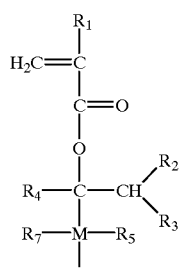

(I)

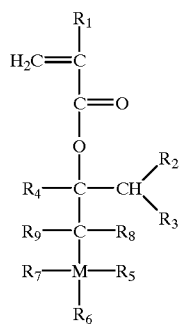

(II)

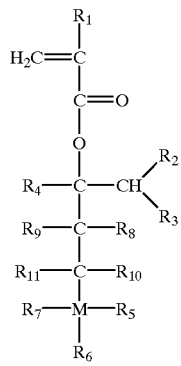

(III)

wherein, $R_1$ is hydrogen or an alkyl containing 1 to 4 carbon atoms; $R_2$ to $R_{11}$ independently represent hydrogen, an alkyl containing 1 to 4 carbon atoms, an alkoxy containing 1 to 4 carbon atoms, a phenyl, a benzyl, a phenoxy or —$MR'_3$ wherein R' is an alkyl containing 1 to 4 carbon atoms, an alkoxy containing 1 to 4 carbon atoms, a phenyl, a benzyl or a phenoxy; and M represents Si, Ge Sn or OSi, wherein the group containing M in any of I, II or III is susceptible to cleaving from the COO group in the presence of an acid.

2. A photoresist, comprising a polymer containing at least one of the monomers represented by the following formulas I–III:

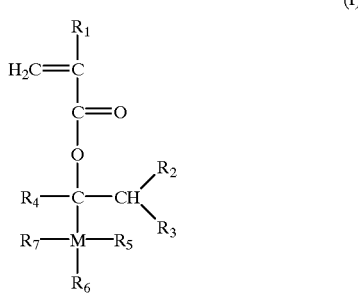

(I)

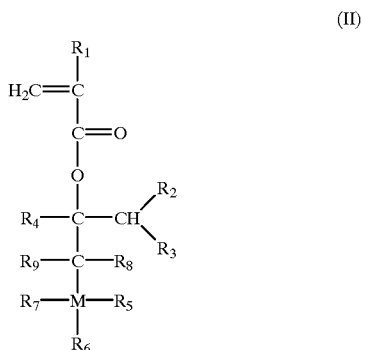

(II)

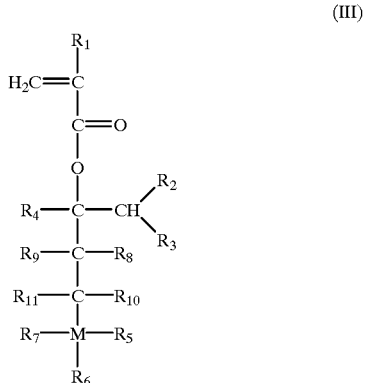

(III)

wherein, $R_1$ is hydrogen or an alkyl containing 1 to 4 carbon atoms; $R_2$ to $R_{11}$ independently represent hydrogen, an alkyl containing 1 to 4 carbon atoms, an alkoxy containing 1 to 4 carbon atoms, a phenyl, a benzyl, a phenoxy or —$MR'_3$ wherein R' is an alkyl containing 1 to 4 carbon atoms, an alkoxy containing 1 to 4 carbon atoms, a phenyl, a benzyl or a phenoxy; and M represents Si, Ge Sn or OSi, wherein the group containing M in any of I, II or III is susceptible to cleaving from the COO group in the presence of an acid.

3. A photoresist in accordance with claim 2, wherein the polymer is a homopolymer consisting of one of said three monomers, a copolymer consisting of two of said three monomers, or a terpolymer consisting of said three monomers.

* * * * *